LONG-SLOT COUPLED WAVE PROPAGATING CIRCUIT

Filed April 18, 1960 2 Sheets-Sheet 1

INVENTORS
MATTHEW A. ALLEN
GORDON S. KINO

BY Paul B. Fike
PATENT AGENT

INVENTORS
MATTHEW A. ALLEN
GORDON S. KINO
BY Paul B. Fike
PATENT AGENT

United States Patent Office 3,205,398
Patented Sept. 7, 1965

3,205,398

LONG-SLOT COUPLED WAVE PROPAGATING CIRCUIT

Matthew A. Allen, 40 Del Monte Ave., Los Altos, Calif., and Gordon S. Kino, 4194 King Arthur Court, Palo Alto, Calif.

Filed Apr. 18, 1960, Ser. No. 23,074
2 Claims. (Cl. 315—3.5)

The present invention relates to radio frequency apparatus, and more particularly, to wave propagating circuits used in traveling wave tube amplifiers and other microwave frequency devices.

Klystrons have been commonly employed as microwave frequency amplifiers and oscillators at both high and low power levels. However, klystrons are extremely limited in their operating frequency range or bandwidth and consequently, if larger bandwidths are required, the more recently developed traveling wave tubes have been utilized. As is known, the traveling wave tube employs a propagating circuit which is periodically loaded so as to conduct the radio frequency wave at a velocity approximating that of the electron beam with which the wave must interact in order to obtain the desired amplification. A metal helix is frequently utilized as such propagating circuit in traveling wave tubes with eminent success at low power levels; large bandwidths and very satisfactory amplification or gain are obtained. However, at higher power levels (e.g. 1 megawatt pulsed power), the helix structure is not capable of dissipating the power nor can the helix be formed so that the requirements of higher velocity wave propagation attendant to the high power operation and of good interaction between the propagated radio frequency wave and the electron beam are met.

Accordingly, it is a general object of the present invention to provide a wave propagating circuit for use in traveling wave tube amplifiers and allied microwave devices at high power levels with excellent amplification and bandwidth characteristics.

More particularly, it is a feature of the invention to provide a wave propagating circuit capable of radio frequency wave transmission or propagation over a relatively wide frequency range or passband.

It is yet another feature of the invention to provide a wave propagating circuit for use in traveling wave tube amplifiers arranged so that the desired amplification of the radio frequency energy can be obtained over a wide frequency range or operating bandwidth.

Yet another feature of the invention is the provision of a wave propagating circuit having the aforementioned desirable amplification and bandwidth characteristics yet which is particularly simple to fabricate.

Figure 1:
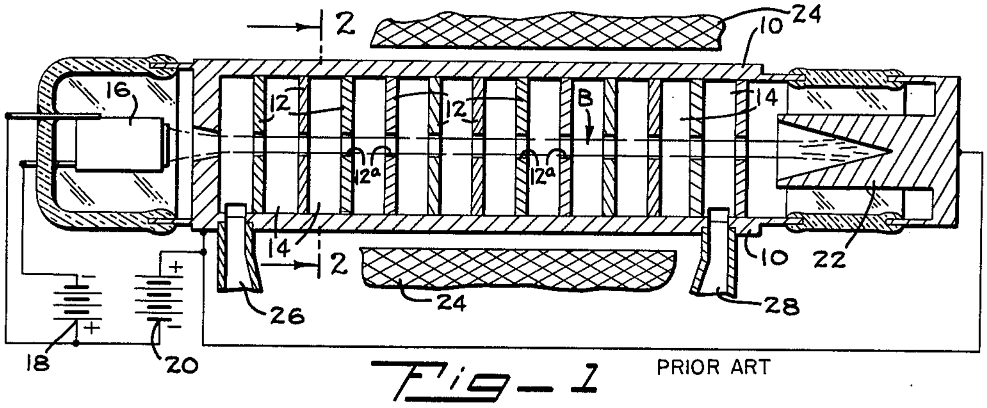

These as well as other objects and features of the invention will become more apparent from a perusal of the following description of the accompanying drawings wherein:

FIG. 1 is a longitudinal central sectional view, somewhat diagrammatic in nature, of a traveling wave tube amplifier employing a known disk-loaded slow wave propagating structure.

Figure 2:
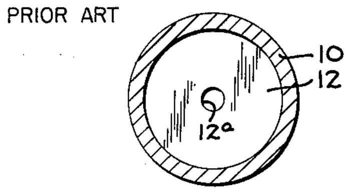
Figure 3:
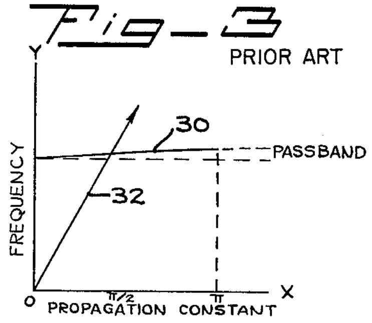
Figure 4:
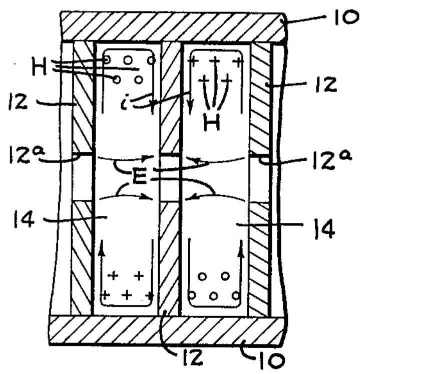
Figure 5:
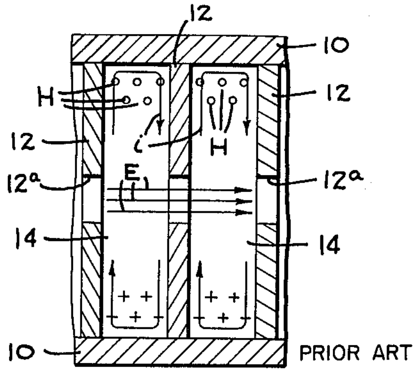
Figure 6:
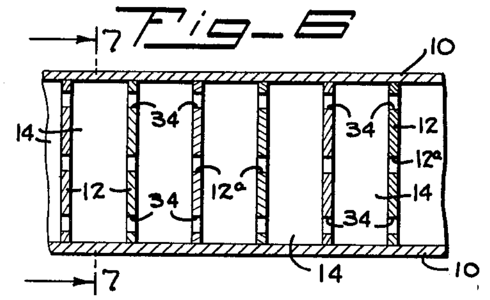
Figure 7:
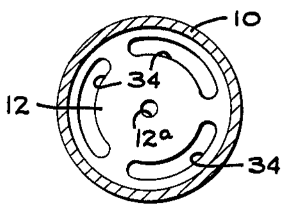
Figure 9:
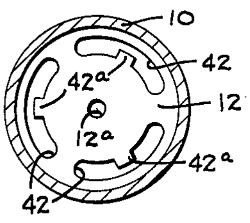
Figure 10:
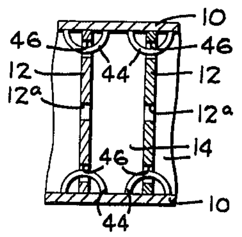
Figure 8:
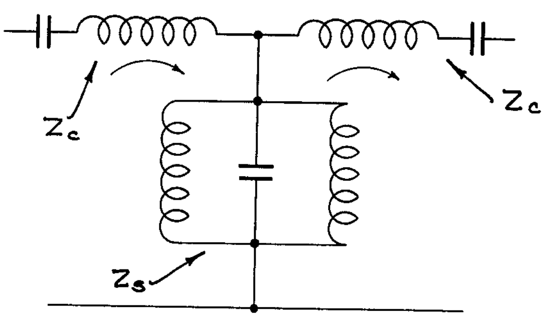
Figure 11:
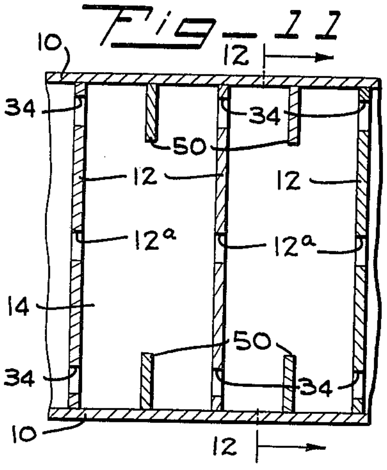
Figure 12:
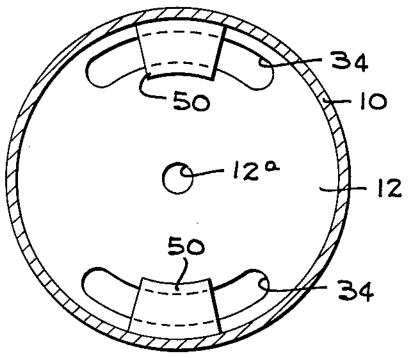
Figure 13:
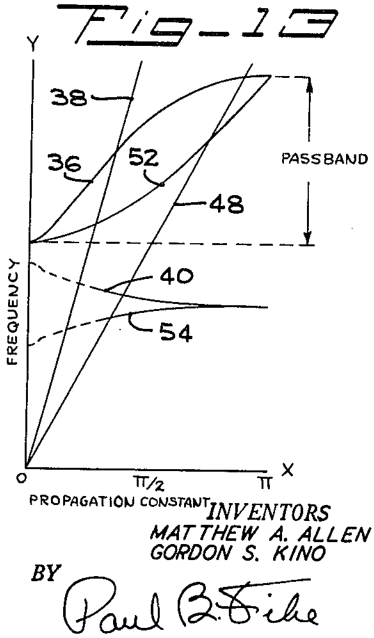

FIG. 2 is a transverse sectional view taken substantially along line 2—2 of FIG. 1, FIG. 3 is a partial Brillouin diagram of the propagating circuit illustrated in FIGS. 1 and 2 illustrating characteristics of fundamental harmonic operation thereof, FIG. 4 is a diagrammatic view of the current and electromagnetic field configurations of two successive periodic sections of the disk-loaded wave propagating structures of FIGS. 1 and 2 when operating on the "π" mode, FIG. 5 is a diagrammatic view similar to FIG. 4 of the current and electromagnetic field configurations of the same disk-loaded wave propagating structure when operating on the "O" mode, FIG. 6 is a fragmentary central sectional view of a long slot-coupled, disk-loaded propagating structure embodying the present invention, FIG. 7 is a transverse sectional view taken along line 7—7 of FIG. 6, FIG. 8 is an equivalent lumped-circuit diagram of the structure illustrated in FIGS. 6 and 7, FIG. 9 is a transverse sectional view similar to FIG. 7 illustrating a modified slot-coupled structure embodying the invention, FIG. 10 is a fragmentary central sectional view of a disk-loaded propagating structure incorporating loop coupling elements and constituting another modified embodiment of the present invention, FIG. 11 is a central fragmentary central sectional view of a further modified wave propagating circuit embodying an additional aspect of the invention, FIG. 12 is a transverse sectional view taken along line 12—12 of FIG. 11, and FIG. 13 is another Brillouin diagram indicating the propagating characteristics of the structures embodying the present invention and shown in FIGS. 6, 7, 9, 10 and 11.

With initial reference to FIGS. 1 and 2, there is illustrated a traveling wave tube amplifier incorporating a wave propagating circuit of known design, whose structure and operating characteristics will first be described in order to enable fuller understanding of the structures embodying the invention, as described hereinafter. The wave propagating circuit, as shown in FIG. 1, includes a generally cylindrical metal tube or waveguide 10 having a plurality of centrally-apertured metal loading disks 12 disposed interiorly thereof at regularly spaced intervals to form a series of like cavity resonators 14. The disk apertures **12*a* are aligned so that electrons, generated from a cathode 16 excited from a suitable filament power supply 18, are accelerated by a suitable positive voltage from another potential source 20 so as to pass axially in a pencil-like beam B through the disk apertures 12*a* to a collector 22. A solenoid 24 or other suitable focusing means is employed to maintain the electron beam B in focus during its passage through the series of disk apertures 12*a*. Radio frequency energy is supplied to the cavity resonator 14 adjacent the cathode end of the tube from an input waveguide 26 and travels the length of the propagating circuit at a rate which is determined by the size and spacing of the loading disks 12. The loading is such that the phase velocity of the radio frequency waves is substantially equivalent to the velocity of the electron beam B wherefore interaction occurs therebetween to provide amplification of the input radio frequency energy. The amplified radio frequency energy is finally delivered through an output wave guide 28 joined to the last cavity resonator 14** of the tube to a suitable load (not shown).

In certain respects, the disk-loaded waveguide is a very suitable propagating circuit for high power traveling wave tube operation. Since it consists of metallic disks 12 and the surrounding cylindrical waveguide 10, it is capable of great power dissipation. Also the loading provided by the disks 12 can be arranged so that the requirement for equivalent velocities of the electrons and the radio frequency wave can be attained readily. Finally, good amplification of the radio frequency energy is enabled. However, the only coupling between the adjacent cavity resonators 14 is provided by the small central apertures **12*a* in the disks 12** which severely restricts the bandwidth of the described structure.

This bandwidth restriction can be more readily explained by reference to the Brillouin diagram of FIG. 3 wherein the Y-axis represents the frequency of operation and the X-axis represents the propagation constant indicative of the amount of phase shift between adjoining cavity resonators 14. The passband curve 30 for the disk-loaded structure extends upwardly a small amount from a minimum at "O" phase shift to a maximum at "π" phase shift, these minimum and maximum points representing respectively the lower and upper cutoff frequencies of the structure. Thus, the vertical or Y-distance between these minimum and maximum points represents the total frequency passband of the described disk-loaded structure and is, in practice, limited by the size of the disk apertures 12*a* to a very small percent of the operating frequency. In practice, a disk-loaded structure, as illustrated in FIGS. 1 and 2, normally has a total passband of approximately 3% of the operating frequency.

The instantaneous slope of the described passband curve 30 corresponds to the group velocity of the radio frequency wave or, in other words, the velocity of energy propagation along the propagating structure, and, as shown in FIG. 3, the group velocity of the disk-loaded structure is always positive in the interval between "O" and "π" which represents fundamental harmonic operation of the structure. The phase velocity of the radio frequency wave is in turn indicated by the slope of a straight line 32 emanating from the origin in FIG. 3 and the slope of such line is, of course, determined by the velocity of the electrons since the phase velocity and the electron velocity must substantially coincide if good interaction is to be obtained. The ratio between the phase velocity and the group velocity is determinative of the useful operating bandwidth of any propagating structure, the ideal condition being represented by a phase velocity to group velocity ratio of unity. Inspection of the Brillouin diagram of FIG. 3 will indicate that this ideal condition of unity can never exist over the passband and that as the phase velocity increases, the ratio also increases so as to restrict the useful operating bandwidth of the structure of FIG. 1 to a frequency range substantially less than that represented by its total passband.

A disk-loaded waveguide, as illustrated, is normally operated in a transverse magnetic mode commonly known as the $TM_{010}$ mode, such mode providing strong transverse magnetic fields near the wall of the cylindrical waveguide 10 and strong axially-directed electric fields in the vicinity of the electron beam B so as to produce good interaction therebetween. At the upper cut-off frequency, as indicated by the maximum of the passband curve 30 of FIG. 3, the so-called "π" mode of operation is experienced, whose current and field configurations are illustrated in FIG. 4. Such "π" mode of operation indicates that adjoining cavities are out of phase by precisely 180 electrical degrees; wherefore, in the adjoining cavities the current flow *i* as well as the central electric fields E and the circumferential transverse magnetic fields H are reversed. On the other hand, in the "O" mode of operation at the lower cut-off frequency, the adjoining cavities are in electrical phase so that the current flow *i*, the electric fields E and the magnetic fields H are similarly oriented in adjoining cavities. Since, as previously mentioned, the electric fields E on the axis of the disk-loaded waveguide structure provide the useful interaction with the electrons in the beam B, an inspection of FIGS. 4 and 5 will immediately indicate the basis for restriction of the size of the disk apertures 12*a* which provide coupling between adjoining cavities. If the disk apertures 12*a* were enlarged, a larger passband would be obtained, but at the same time, the strength of the electric fields E on the axis of the structure would be decreased so that the useful interaction with the electrons and ultimately the total amplification of the radio frequency energy would be sacrificed for the increase in bandwidth.

Generally, in accordance with the present invention, the disk-loaded waveguide propagating structure described hereinabove is modified in a manner such that its desirable characteristics are retained but its restricted bandwidth is eliminated. More particularly, the total passband of the structure is considerably increased without sacrificing interaction between the electric fields E and the electrons in the beam B and furthermore the ratio of the phase velocity to the group velocity of the radio frequency wave is brought closer to unity over the entire passband so that a greater operating bandwidth is obtained. Essentially, with reference to FIG. 3, the upper cut-off frequency at "π" phase shift on the passband curve 30 is substantially raised so that the total passband is increased and the shape of the passband curve 30 is changed in a manner such that the group velocity of the radio frequency energy is also increased to more nearly approach the phase velocity in value over the passband.

One embodiment of the invention is disclosed in FIGS. 6 and 7 wherein a plurality of long circumferential slots 34 are formed in the disks 12 in a region of large magnetic field, or in other words, near the walls of the cylindrical waveguide 10. The effect of the incorporation of the long circumferential slots 34 can be best understood by reference again to FIGS. 4 and 5 showing the "π" and "O" modes of operation. In the "O" mode of operation, the magnetic fields H are similarly directed in adjoining cavities and, as a consequence, the slots 34 effect substantially no perturbation of such fields. In other words, it might be stated that there is no effective magnetic coupling between cavities. On the other hand, in the "π" mode of operation where the magnetic fields H are oppositely directed on opposite sides of the disk 12, the slot 34 will perturb such fields and magnetic field coupling will exist between the cavities to vary the frequency of the "π" mode of operation in a manner dependent upon the shape and number of the slots. The described effects at the "O" and "π" modes of operation represent the extremes and generally speaking the effect over the passband will vary from a negligible amount at the "O" mode of operation to a maximum at the "π" mode.

In accordance with the present invention, the slots 34 or any alternative coupling means are arranged to raise the frequency at the "π" mode of operation while leaving the "O" mode frequency unaltered so that the total passband is increased over that illustrated in FIG. 3 and furthermore the slope of the passband curve 30 is increased wherefore ultimately the value of the group velocity is also increased.

As is known, the resonant frequency of the uncoupled cavity resonators 14 in the operating $TM_{010}$ mode is determined by cavity dimensions and, more particularly, by the axial and radial dimensions of such cavities. The coupling slots 34 also have a resonance and a frequency passband which are determined by the slot dimensions, and the dimensions of the cavity with which the slots are associated, the length and width of the slots being of prime importance. Both types of resonances can be calculated by known methods. In practice, the slot resonant frequency may be determined experimentally by determination of the "O" phase shift points of the cavity and slot passbands. One "O" point will correspond almost exactly to the uncoupled cavity resonant frequency, the other "O" point to the slot resonant frequency.

In order to effect the desired increase in the cavity passpand and in the group velocity, the essential characteristic of the slot 34 is that its resonant frequency be below that of the resonant frequency of the uncoupled cavity. Most simply, the resonant frequency of each slot 34 can be lowered by increasing its circumferential length, which raises the effective capacity of the slot. The three long circumferential slots 34 shown in FIGS. 6 and 7 each has a resonant frequency below that of the adjoining cavities, and the effect of the three is cumulative; that is, the addition of each of the slots raises the upper cut-off frequency of the passband.

The observed effect can perhaps be understood more readily by reference to FIG. 8 wherein a lumped-circuit transmission line equivalent to the described long-slot coupled propagating structure is illustrated. The series resonant circuits $Z_c$ corresponding to two adjoining cavity resonators 14 are coupled by a parallel resonant circuit $Z_s$ corresponding to the described slots 34. As will be apparent, the general circuit configuration is that of a bandpass filter with the series resonant circuits $Z_c$ presenting a low impedance at the resonant frequency of such circuits and the parallel resonant circuit $Z_s$ presenting a high impedance at its resonance. The resonant frequencies of both circuits are of course dependent upon their respective values of inductance and capacitance, and in accordance with the present invention, the values of the inductance and capacitance of the slot resonators are chosen to provide a resonant frequency lower than that of the adjoining cavity resonators 14. Preferably, the resonant frequency of the slot is just slightly below that of the cavity resonators wherefore a high impedance is presented and, as a result, maximum energy transmission or propagation is effected. At operating frequencies equal to or above the resonant frequency of the uncoupled cavity resonators 14, the slot resonator will appear as predominantly capacitive in its effect so as to increase the upper cut-off frequency of the frequency passband.

The total passband of the described long-slot coupled structure is illustrated in the Brillouin diagram of FIG. 13. A total passband of 50% or greater is obtained. More particularly, the passband curve 36 which rises quickly upwardly from the "O" phase shift point and somewhat levels off as it approaches the "$\pi$" phase shift point represents the characteristic of this circuit. It can be observed that the greater part of the passband is below the "$\pi/2$" point on the curve 36 which will necessitate a relatively large phase velocity and also, of course, a correspondingly high velocity electron beam to provide maximum operating bandwidth. A phase velocity line indicated at 38, having a value of approximately 0.8*c* where "*c*" is the velocity of light, is appropriate for use in the described long-slot coupled structure in order to obtain maximum usefulness of the total passband and also a low ratio of phase velocity to group velocity. In other words, the described long-slot coupled structure of FIGS. 6 and 7 may be considered as a high velocity structure.

With continued reference to FIG. 13, there also exists in the described long-slot coupled structure the mentioned slot passband which generally is a lower frequency passband and is represented by a curve 40 which extends from a "O" phase shift point corresponding to the resonant frequency of the slots 34 downwardly to a somewhat lower frequency at the "$\pi$" phase shift point of the diagram. In practice, this slot passband must be suppressed, which suppression can be achieved by conventional methods of selective coupling to an attenuator structure tuned to the frequencies covered by such passband. As can be seen by reference to FIG. 13, such passband is relatively narrow and the desired suppression can be easily achieved.

It will be apparent that resonant coupling elements other than the described long-circumferential slots 34 can be employed in accordance with the principles of the present invention. A hole in the disk 12 properly dimensioned but of widely variant shape can be utilized so long as the resonant frequency of the hole is below that of the resonant frequency of the uncoupled cavities. As one example, and with reference to FIG. 9, a slot 42 is narrowed at its central portion as indicated at 42*a* so as to increase its effective capacity and thus decrease its resonant frequency to a value below that of the resonant frequency of the adjoining cavity resonator 14. Furthermore, loop coupling members, as indicated at 44 in FIG. 10, and extending through slots 46 in the disk 12 can be utilized, the dimensions again being chosen so that the resonant frequency of the coupling members 44 is below that of the cavity resonators 14.

For operation of a traveling wave tube amplifier in the normal fashion to achieve a pulsed power output of one megawatt, accelerating or beam voltages in the neighborhood of 80 kilovolts are normally employed. Such beam voltages provide an electron velocity approximately 0.5*c* and this, of course, necessitates a phase velocity of approximately 0.5*c*. Such a phase velocity is indicated by the second phase velocity line 48 in FIG. 13 and its point of intersection with the upper passband curve 36 whose instantaneous slope is indicative of the group velocity of the long-slot coupled structure of FIGS. 6 and 7 immediately indicates that only a narrow operating bandwidth and a relatively high ratio of phase velocity to group velocity would result.

As a consequence, in accordance with another aspect of the present invention, additional field perturbing elements are added to the long-slot coupled structure of FIGS. 6 and 7 in a manner such that the total passband is maintained but the shape of the passband curve is changed in a manner so that a lower phase velocity can be utilized and the ratio of such phase velocity to the group velocity is decreased to a value nearer unity.

The change in the passband shape is effected, as shown in FIGS. 11 and 12, through the addition of narrow inwardly-projecting fins 50 disposed substantially at the cavity mid-planes and in longitudinal alignment with the slots 34. The frequency at "O" phase shift is unaltered by the presence of the fins 50 since for the upper or cavity passband, there exists no field in the slot 34. Similarly, the fins 50 do not perturb the fields at "$\pi$" phase shift since there exists no fields in the direction of the fin 50 wherefore the frequency again remains unaltered. However, between the extremes of "O" and "$\pi$" phase shift, fringing fields existing in the slots 34 will tend to be terminated by the narrow fins 50 wherefore the effective slot capacity is increased to lower the slot impedance and ultimately produce a lower frequency in the upper passband. The shape of the upper passband then takes the form of the second curve 52 in FIG. 13. It may be mentioned that if the fins 50 are wider, both slot capacity and inductance are affected in a manner to again reduce the slot impedance and produce a passband curve substantially as shown at 52. It will be immediately obvious that with a phase velocity of 0.5*c* as indicated by the phase velocity line 48, a large operating bandwidth and low ratio of phase velocity to group velocity will be obtained. In actual practice, with the structure illustrated in FIGS. 11 and 12, operating at 80 kilovolts, an operating bandwidth of 25% is obtained.

It may also be mentioned that the shape of the lower or slot passband is also varied by the addition of the fins 50, the effect being more noticeable at values approaching "O" phase shift and, in actual fact, the lower passband shape resulting from the addition of the described narrow fins 50 is represented by a lower passband curve 54 with a positive slope. However, this passband is relatively narrow and can be readily suppressed by known methods.

Various alterations and/or modifications of the described structures can obviously be made without departing from the spirit of the invention, and accordingly, the foregoing description of several embodiments is to be considered as purely exemplary and not in a limiting sense. The actual scope of the invention is to be indicated by reference to the appended claims.

What is claimed is:

1. A traveling wave tube which comprises means for generating a beam of electrons, a wave propagating structure including a generally cylindrical waveguide and a series of disk-loading elements therein at periodic intervals, each disk having a central aperture aligned with said electron beam, said disk-loaded cylindrical waveguide forming a plurality of cavity resonators having a predetermined resonant frequency, means coupling adjoining cavity resonators and having a resonant frequency below that of said cavity resonators, a field-perturbing fin disposed between said disks in each of said cavity resonators, means for supplying radio frequency energy to said wave propagating structure at one end thereof, and means for withdrawing the amplified radio frequency energy from the other end of said wave propagating structure.

2. A wave propagating circuit comprising a plurality of adjoining cavity resonators, each pair of adjoining cavity resonators having a common wall therebetween, each wall having a coupling hole therethrough, and means in each of said cavity resonators for perturbing the coupling fields adjacent said holes, said field-perturbing means including a metal fin in each of said cavities adjacent said coupling hole.

References Cited by the Examiner

UNITED STATES PATENTS

| | | | |
|---|---|---|---|
| 2,636,948 | 4/53 | Pierce | 315—3.6 |
| 2,637,001 | 4/53 | Pierce | 315—3.6 |
| 2,842,705 | 7/58 | Chodorow | 315—5.42 |

OTHER REFERENCES

RCA Review, June 1958, vol. XIX, No. 2, pages 283 to 310, Propagation Characteristics of Slow-Wave Structures Derived from Coupled Resonators, by E. Belohoubek.

GEORGE N. WESTBY, *Primary Examiner.*

ARTHUR GAUSS, *Examiner.*